(12) United States Patent
Zhu

(10) Patent No.: US 11,307,706 B2
(45) Date of Patent: Apr. 19, 2022

(54) FPC CONNECTOR, TOUCH-SENSITIVE SCREEN AND DISPLAY DEVICE

(71) Applicant: Shenzhen Startek Electronic Technology Co., Ltd., Shenzhen (CN)

(72) Inventor: Dejun Zhu, Shenzhen (CN)

(73) Assignee: SHENZHEN STARTEK ELECTRONIC TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 17/107,959

(22) Filed: Dec. 1, 2020

(65) Prior Publication Data

US 2021/0103375 A1 Apr. 8, 2021

Related U.S. Application Data

(63) Continuation-in-part of application No. 16/086,002, filed as application No. PCT/CN2018/080127 on Mar. 23, 2018, now Pat. No. 10,886,652.

(51) Int. Cl.
*G06F 3/041* (2006.01)
*G06F 1/18* (2006.01)

(52) U.S. Cl.
CPC .......... *G06F 3/04164* (2019.05); *G06F 1/189* (2013.01); *G06F 3/0412* (2013.01); *G06F 2203/04102* (2013.01)

(58) Field of Classification Search
CPC .. H01R 13/025; H01R 12/7076; H01R 13/03; H01R 12/77; G06F 3/0488; H05K 1/0298; H05K 1/114; H05K 1/117; H05K 1/112; H05K 3/4069
See application file for complete search history.

(56) References Cited

U.S. PATENT DOCUMENTS

| 8,274,634 | B2 * | 9/2012 | Oikawa | G06F 3/045 |
| | | | | 349/150 |
| 10,123,411 | B2 * | 11/2018 | Matsumura | H05K 3/281 |
| 10,886,652 | B2 * | 1/2021 | Zhu | H01R 12/7076 |

\* cited by examiner

*Primary Examiner* — Renee S Luebke
*Assistant Examiner* — Paul D Baillargeon

(57) ABSTRACT

An FPC connector includes a first insulating layer, a first circuit layer, a second insulating layer, a third insulating layer, and a second circuit layer. The first circuit layer is arranged between the first insulating layer and the second insulating layer. The first circuit layer includes a number of conductive strips. The third insulating layer is arranged between the first insulating layer and the first circuit layer. The second circuit layer includes a number of conductive strips provided on an upper side of the third insulating layer. Ends of the conductive strips of the second circuit layer pass through the third insulating layer and are correspondingly connected to the conductive strips of the first circuit layer. The first circuit layer and the second insulating layer each has a forepart extending beyond a front end of each of the first insulating layer, the third insulating layer, and the second circuit layer.

33 Claims, 5 Drawing Sheets

FPC CONNECTOR, TOUCH-SENSITIVE SCREEN AND DISPLAY DEVICE

CROSS-REFERENCE TO RELATED APPLICATIONS

This application is a continuation-in-part of and claims priority from application Ser. No. 16/086,002, which was filed on Sep. 17, 2018, and claims priority to Chinese Patent Application No. 201720178982.2, filed Feb. 27, 2017, The application is incorporated by reference herein in its entirety.

BACKGROUND

1. Technical Field

The present application relates to connectors, and in particular, to an FPC connector, a touch-sensitive screen and a display device.

2. Description of Related Art

At present, devices such as touch-sensitive screens, LCD displays and OLED displays have been developed toward the trend of thinning, multi-functionality and high performance.

Welded-type flexible printed circuits (FPCs) are employed in the traditional LCD screens and touch-sensitive screens. Such FPC has a PIN distance of more than 0.8 mm due to technical limitations, such that no more PINs can be accommodated within a unit width (usually 37 PINs). In this way, it's impossible for multiple interfaces to coexist, and the interfaces are easily subjected to damage during welding the FPC to a mainboard, resulting non-reusability, large waste and also inconvenience in maintenance. Obviously, it cannot meet the needs for development of the above-mentioned devices (e.g., touch-sensitive screens, LCD displays).

SUMMARY

One object of the present application is to provide an FPC connector, a touch-sensitive screen and a display device, for solving the problems that it's impossible for multiple interfaces to coexist, and that the interfaces are easily subjected to damage during welding the FPC to a mainboard, resulting in non-reusability, large waste and also inconvenience in maintenance.

In one embodiment, an FPC connector (referred to as "first FPC connector") is provided. The FPC connector includes a first insulating layer, a first circuit layer, a second insulating layer, a third insulating layer, and a second circuit layer. The first circuit layer is arranged between the first insulating layer and the second insulating layer. The first circuit layer includes a number of conductive strips. The third insulating layer is arranged between the first insulating layer and the first circuit layer. The second circuit layer includes a number of conductive strips that are provided on an upper side face of the third insulating layer. Ends of the conductive strips of the second circuit layer pass through the third insulating layer and are correspondingly connected to the plurality of conductive strips of the first circuit layer. The first circuit layer and the second insulating layer each has a forepart extending beyond a front end of each of the first insulating layer, the third insulating layer, and the second circuit layer.

The exemplary FPC above has the following advantages. The first insulating layer and the second insulating layer insulate and protect the first circuit layer. High routing density, lightweight, slimness, and flexibility of the first insulating layer, the first circuit layer and the second insulating layer can be achieved to meet the requirement of miniaturization, thinning, and flexibility in space allocation for electronic products. Coexistence of multiple interfaces can be achieved. The PFC is connected to the main board in an inserting manner, which is easier than welding, without damaging the interfaces, and leading to convenience in use, time saving and reusability.

The present application can also be improved as follows based on the above technical solution.

In one embodiment, the third insulating layer defines a plurality of vias, and the ends of the plurality of conductive strips of the second circuit layer pass through the plurality of vias and are correspondingly connected to the plurality of conductive strips of the first circuit layer. The present application has a further advantage that the vias facilitate the connection of the first circuit layer to the second circuit layer, such that high routing density can be achieved.

In one embodiment, foreparts of the plurality of conductive strips of the first circuit layer are arranged in parallel at equal pitches.

In one embodiment, a reinforcing plate is provided at an underside of the second insulating layer, a metal layer is disposed on an upper side surface of foreparts of the plurality of conductive strips of the first circuit layer to constitute metal fingers, and the reinforcing plate is positioned right below the metal fingers. The present application has a further advantage that strength of the FPC connector can be enhanced by the reinforcing plate.

In one embodiment, the first insulating layer, the second circuit layer, the third insulating layer, the first circuit layer, the second insulating layer and the reinforcing plate are sequentially bonded to one another by thermosetting adhesive and hot pressing. The present application has a further advantage that connections between the first insulating layer, the second circuit layer, the third insulating layer, the first circuit layer, the second insulating layer and the reinforcing plate can be enhanced by the thermosetting adhesive and the hot pressing.

In one embodiment, the forepart of the first circuit layer, the forepart of the second insulating layer and the reinforcing plate extend beyond a front end of each of the first insulating layer, the third insulating layer, and the second circuit layer, and are equal in length and width and completely overlap one another.

In an alternative embodiment, an FPC connector (referred to as "second FPC connector") includes a first insulating layer, a first circuit layer, a second insulating layer, a third insulating layer, a second circuit layer, and a reinforcing plate. The first circuit layer is arranged between the first insulating layer and the second insulating layer. The first circuit layer includes a number of conductive strips. The third insulating layer is arranged between the first insulating layer and the first circuit layer. The second circuit layer includes a number of conductive strips that are provided on an upper side face of the third insulating layer. Ends of the conductive strips of the second circuit layer pass through the third insulating layer and are correspondingly connected to the plurality of conductive strips of the first circuit layer. The first circuit layer, the third insulating layer, and the first insulating layer each has a forepart extending beyond a front end of the second insulating layer. The reinforcing plate is arranged on an upper side face of the first insulating layer.

A metal layer is disposed on an under side surface of foreparts of the plurality of conductive strips of the first circuit layer to constitute metal fingers, and the reinforcing plate is positioned right above the metal fingers.

In one embodiment, the third insulating layer defines a plurality of vias, and the ends of the plurality of conductive strips of the second circuit layer pass through the plurality of vias and are correspondingly connected to the plurality of conductive strips of the first circuit layer. The present application has a further advantage that the vias facilitate the connection of the first circuit layer to the second circuit layer, such that high routing density can be achieved.

In one embodiment, foreparts of the plurality of conductive strips of the first circuit layer are arranged in parallel at equal pitches.

In one embodiment, the reinforcing plate, the first insulating layer, the second circuit layer, the third insulating layer, the first circuit layer, the second insulating layer are sequentially bonded to one another by thermosetting adhesive and hot pressing. The present application has a further advantage that connections between the reinforcing plate, the first insulating layer, the second circuit layer, the third insulating layer, the first circuit layer, the second insulating layer can be enhanced by the thermosetting adhesive and the hot pressing.

In one embodiment, the forepart of the first circuit layer, the forepart of the third insulating layer, the forepart of the first insulating layer, and the reinforcing plate extend beyond a front end of the second insulating layer, and are equal in length and width and completely overlap one another.

In one embodiment, a touch-sensitive screen includes the first FPC connector.

In one embodiment, the third insulating layer defines a plurality of vias, and the ends of the plurality of conductive strips of the second circuit layer pass through the plurality of vias and are correspondingly connected to the plurality of conductive strips of the first circuit layer. The present application has a further advantage that the vias facilitate the connection of the first circuit layer to the second circuit layer, such that high routing density can be achieved.

In one embodiment, foreparts of the plurality of conductive strips of the first circuit layer are arranged in parallel at equal pitches.

In one embodiment, a reinforcing plate is provided at an underside of the second insulating layer, a metal layer is disposed on an upper side surface of foreparts of the plurality of conductive strips of the first circuit layer to constitute metal fingers, and the reinforcing plate is positioned right below the metal fingers. The present application has a further advantage that strength of the FPC connector can be enhanced by the reinforcing plate.

In one embodiment, the first insulating layer, the second circuit layer, the third insulating layer, the first circuit layer, the second insulating layer and the reinforcing plate are sequentially bonded to one another by thermosetting adhesive and hot pressing. The present application has a further advantage that connections between the first insulating layer, the second circuit layer, the third insulating layer, the first circuit layer, the second insulating layer and the reinforcing plate can be enhanced by the thermosetting adhesive and the hot pressing.

In one embodiment, the forepart of the first circuit layer, the forepart of the second insulating layer and the reinforcing plate extend beyond a front end of each of the first insulating layer, the third insulating layer, and the second circuit layer, and are equal in length and width and completely overlap one another.

In an alternative embodiment, a touch-sensitive screen includes the second FPC connector.

In one embodiment, the third insulating layer defines a plurality of vias, and the ends of the plurality of conductive strips of the second circuit layer pass through the plurality of vias and are correspondingly connected to the plurality of conductive strips of the first circuit layer. The present application has a further advantage that the vias facilitate the connection of the first circuit layer to the second circuit layer, such that high routing density can be achieved.

In one embodiment, foreparts of the plurality of conductive strips of the first circuit layer are arranged in parallel at equal pitches.

In one embodiment, the reinforcing plate, the first insulating layer, the second circuit layer, the third insulating layer, the first circuit layer, the second insulating layer are sequentially bonded to one another by thermosetting adhesive and hot pressing. The present application has a further advantage that connections between the reinforcing plate, the first insulating layer, the second circuit layer, the third insulating layer, the first circuit layer, the second insulating layer can be enhanced by the thermosetting adhesive and the hot pressing.

In one embodiment, the forepart of the first circuit layer, the forepart of the third insulating layer, the forepart of the first insulating layer, and the reinforcing plate extend beyond a front end of the second insulating layer, and are equal in length and width and completely overlap one another.

In one embodiment, a display device includes the first FPC connector.

In one embodiment, the third insulating layer defines a plurality of vias, and the ends of the plurality of conductive strips of the second circuit layer pass through the plurality of vias and are correspondingly connected to the plurality of conductive strips of the first circuit layer. The present application has a further advantage that the vias facilitate the connection of the first circuit layer to the second circuit layer, such that high routing density can be achieved.

In one embodiment, foreparts of the plurality of conductive strips of the first circuit layer are arranged in parallel at equal pitches.

In one embodiment, a reinforcing plate is provided at an underside of the second insulating layer, a metal layer is disposed on an upper side surface of foreparts of the plurality of conductive strips of the first circuit layer to constitute metal fingers, and the reinforcing plate is positioned right below the metal fingers. The present application has a further advantage that strength of the FPC connector can be enhanced by the reinforcing plate.

In one embodiment, the first insulating layer, the second circuit layer, the third insulating layer, the first circuit layer, the second insulating layer and the reinforcing plate are sequentially bonded to one another by thermosetting adhesive and hot pressing. The present application has a further advantage that connections between the first insulating layer, the second circuit layer, the third insulating layer, the first circuit layer, the second insulating layer and the reinforcing plate can be enhanced by the thermosetting adhesive and the hot pressing.

In one embodiment, the forepart of the first circuit layer, the forepart of the second insulating layer and the reinforcing plate extend beyond a front end of each of the first insulating layer, the third insulating layer, and the second circuit layer, and are equal in length and width and completely overlap one another.

In an alternative embodiment, a display device includes the second FPC connector.

In one embodiment, the third insulating layer defines a plurality of vias, and the ends of the plurality of conductive strips of the second circuit layer pass through the plurality of vias and are correspondingly connected to the plurality of conductive strips of the first circuit layer. The present application has a further advantage that the vias facilitate the connection of the first circuit layer to the second circuit layer, such that high routing density can be achieved.

In one embodiment, foreparts of the plurality of conductive strips of the first circuit layer are arranged in parallel at equal pitches.

In one embodiment, the reinforcing plate, the first insulating layer, the second circuit layer, the third insulating layer, the first circuit layer, the second insulating layer are sequentially bonded to one another by thermosetting adhesive and hot pressing. The present application has a further advantage that connections between the reinforcing plate, the first insulating layer, the second circuit layer, the third insulating layer, the first circuit layer, the second insulating layer can be enhanced by the thermosetting adhesive and the hot pressing.

In one embodiment, the forepart of the first circuit layer, the forepart of the third insulating layer, the forepart of the first insulating layer, and the reinforcing plate extend beyond a front end of the second insulating layer, and are equal in length and width and completely overlap one another.

DETAILED DESCRIPTION

Principles and features of the present application will be described below with reference to accompanying drawings and embodiments. It should be understood that specific embodiments described herein are merely illustrative of the present application and are not intended to limit the present application.

Embodiment 1

Figure 1:
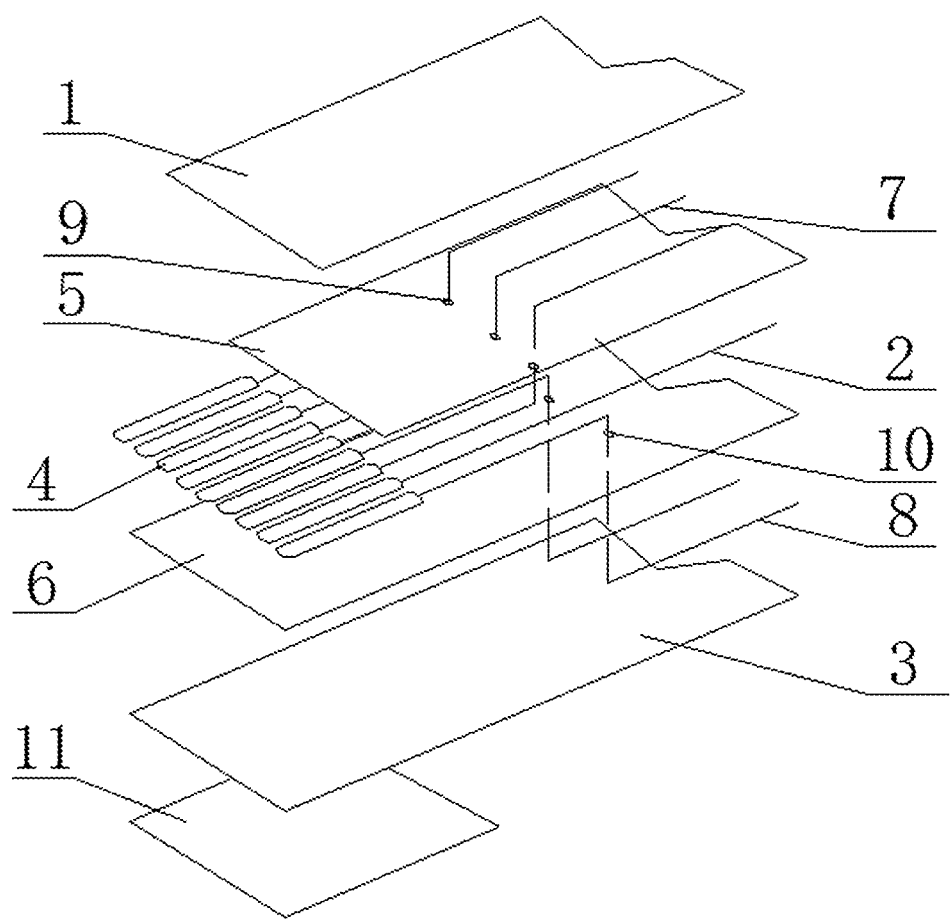
FIG. 1 schematically shows an exploded view of the structure of an FPC connector according to one embodiment.
Figure 2:
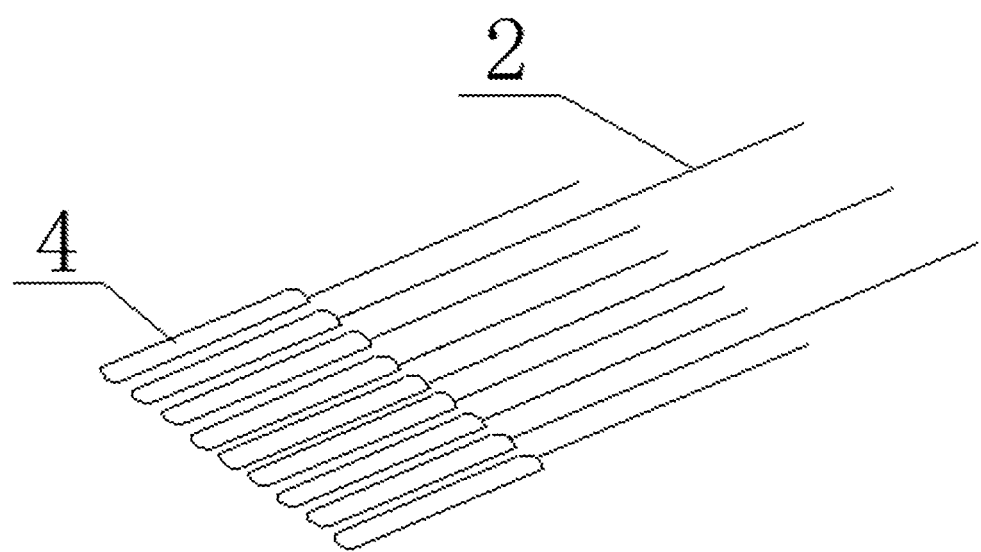
FIG. 2 schematically shows a perspective view of a plurality of conductive strips and a metal layer.
Figure 3:
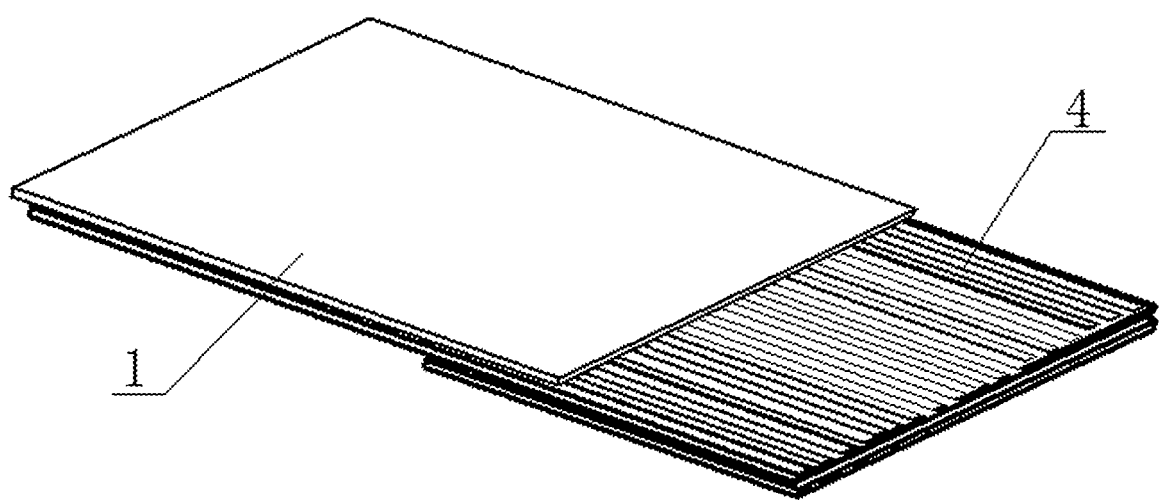
FIG. 3 schematically shows a perspective view of an FPC connector according to the present application.

As shown in FIGS. 1 to 3, an FPC connector is provided, comprising a first insulating layer 1, a first circuit layer 2 and a second insulating layer 3. The first circuit layer 2 is located at an underside of the first insulating layer 1, and the second insulating layer 3 is located at an underside of the first circuit layer 2. The first circuit layer 2 and the second insulating layer 3 each has a forepart extending beyond a front end of the first insulating layer 1. The first circuit layer 2 comprises a plurality of conductive strips having foreparts arranged in parallel at equal intervals. A metal layer 4 is plated with or deposited on the foreparts of the first circuit layer 2. The metal layer 4 and the foreparts of the first circuit layer 2 constitute metal fingers.

The first insulating layer 1 and the second insulating layer 3 insulate and protect the first circuit layer 2. High routing density, lightweight, slimness, and flexibility of the first insulating layer 1, the first circuit layer 2 and the second insulating layer 3 can be achieved to meet the requirement of miniaturization, thinning, and flexibility in space allocation for electronic products. The metal layer 4 can enhance electrical conductivity and hardness of the circuit. Coexistence of multiple interfaces can be achieved. The PFC is connected to the main board in an inserting manner, which is easier than welding, without damaging the interfaces, and leading to convenience in use, time saving and reusability.

In the embodiment above, N third insulating layers 5 are provided between the first insulating layer 1 and the first circuit layer 2. A second circuit layer 7 comprising a plurality of conductive strips is provided on an upper side face of each third insulating layer 5. The plurality of conductive strips on the second circuit layer 7 extend downward to pass through the N third insulating layers 5 and then to correspondingly connect with the plurality of conductive strips on the first circuit layer 2. N fourth insulating layers 6 are provided between the second insulating layer 3 and the first circuit layer 2. A third circuit layer 8 comprising a plurality of conductive strips is provided on a lower side face of each fourth insulating layer 6. The plurality of conductive strips on the third circuit layer 8 extend upward to pass through the N fourth insulating layer 6 and then to correspondingly connect with the plurality of conductive strips on the first circuit layer 2. N is an integer which is greater than or equal to zero.

High routing density, lightweight, slimness, and flexibility of the first insulating layer 1, the first circuit layer 2, the third insulating layer 5, the second circuit layer 7, the fourth insulating layer 6, the third circuit layer 8 and the second insulating layer 3 can be achieved to meet the requirement of miniaturization, thinning, and flexibility in space allocation for electronic products.

In the embodiment above, the conductive strips on the first circuit layer 2, the second circuit layer 7 and the third circuit layer 8 are made of gold, nickel, copper, tin, silver, aluminum or graphene, such materials being characterized by great conductivity.

In the embodiment above, the third insulating layers 5 each has first vias 9, each of the first vias 9 is positioned at a place corresponding to each of the conductive strips on the second circuit layer 7. The plurality of conductive strips on the second circuit layer 7 respectively pass through the corresponding first vias 9 to connect with the plurality of conductive strips on the first circuit layer 2. The fourth insulating layers 6 each has second vias 10, each of the second vias 10 is positioned at a place corresponding to each of the conductive strips on the third circuit layer 8. The conductive strips on the third circuit layer 8 respectively pass through the corresponding second vias 10 to connect with the plurality of conductive strips on the first circuit layer 2. Metallic coating or deposition is performed within the first vias 9 and the second vias 10.

The first vias 9 and the second vias 10 facilitate the connection of the first circuit layer 2 respectively to the second circuit layer 7 and the third circuit layer 8, such that high routing density can be achieved. Metallic coating or deposition is performed within the vias for stability of the connection.

In the above embodiment, a distance between two adjacent conductive strips on the first circuit layer 2 ranges from 0.3 mm to 1.0 mm. With the PIN distance decreases, more PINs can be accommodated within a unit width, so as to reserve a variety of interfaces for such as MCU, RGB, SPI, MIPI, LVDS, I2C, HDMI and USB, and meanwhile to integrate interfaces of the touch-sensitive screen and the inverter board.

In the above embodiment, the first insulating layer 1 and the second insulating layer 3 are made of PI material or PET material, such materials being characterized by good insulation.

In the above embodiment, a reinforcing plate 11 is provided at an underside of the second insulating layer 3. The reinforcing plate 11 is positioned corresponding to a place below the metal fingers.

In the above embodiment, the first insulating layer 1, the second circuit layer 7, the third insulating layer 5, the first circuit layer 2, the fourth insulating layer 6, the third circuit layer 8, the second insulating layer 3 and the reinforcing plate 11 are sequentially bonded by hot pressing. Connections between the first insulating layer 1, the second circuit layer 7, the third insulating layer 5, the first circuit layer 2, the fourth insulating layer 6, the third circuit layer 8, the second insulating layer 3 and the reinforcing plate 11 can be enhanced by the thermosetting adhesive and the hot pressing.

Embodiment 2

Figure 4:
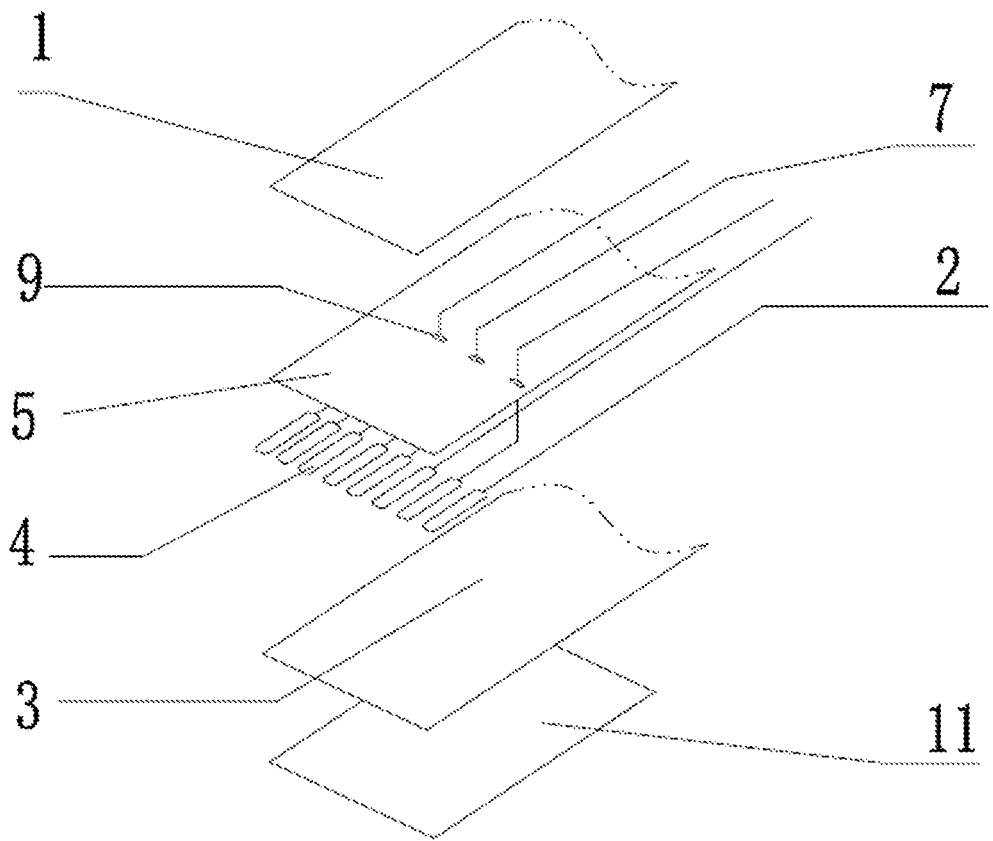
FIG. 4 schematically shows an exploded view of an FPC connector according to another embodiment.

FIG. 4 shows an alternative embodiment of the FPC connector that is similar to the FPC connector of embodiment 1. They differ in that the fourth insulating layers 6 and the third circuit layers 8 are omitted in the present embodiment. Specifically, the FPC connector includes a first insulating layer 1, a first circuit layer 2, a second insulating layer 3, a third insulating layer 5, and a second circuit layer 7. The first circuit layer 2 is arranged between the first insulating layer 1 and the second insulating layer 3. The first circuit layer 2 includes a number of conductive strips. The third insulating layer 5 is arranged between the first insulating layer 1 and the first circuit layer 2. The second circuit layer 7 includes a number of conductive strips that are provided on an upper side face of the third insulating layer 5. Ends of the plurality of conductive strips of the second circuit layer 7 pass through the third insulating layer 5 and are correspondingly connected to the conductive strips of the first circuit layer 2. The first circuit layer 2 and the second insulating layer 3 each has a forepart extending beyond a front end of each of the first insulating layer 1, the third insulating layer 5, and the second circuit layer 7.

In the embodiment, the forepart of the first circuit layer 2, the forepart of the second insulating layer 3 and the reinforcing plate 11 extend beyond a front end of each of the first insulating layer 1, the third insulating layer 5, and the second circuit layer 7, and are equal in length and width and completely overlap one another.

Embodiment 3

Figure 5:
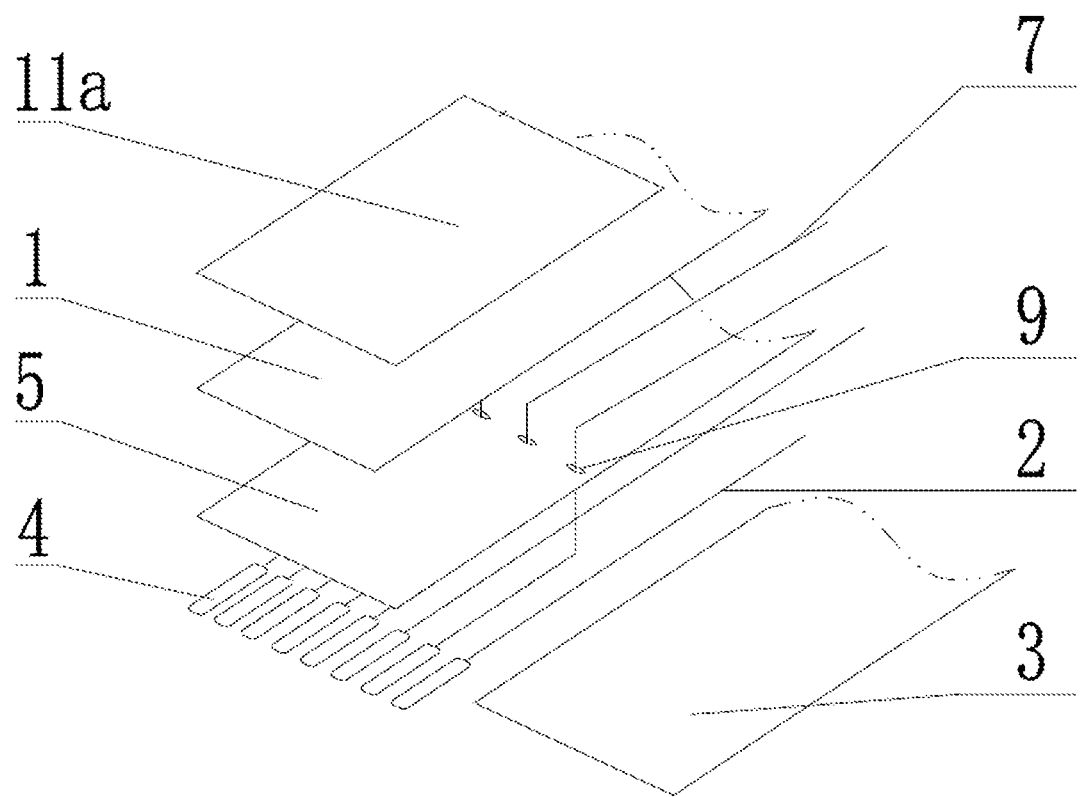
FIG. 5 schematically shows an exploded view of an FPC connector according to another embodiment.

FIG. 5 shows an alternative embodiment of the FPC connector that is similar to the FPC connector of embodiment 1. They differ in that the fourth insulating layers 6 and the third circuit layers 8 are omitted in the present embodiment. Specifically, the FPC connector includes a first insulating layer 1, a first circuit layer 2, a second insulating layer 3, a third insulating layer 5, a second circuit layer 7, and a reinforcing plate 11a. The first circuit layer 2 is arranged between the first insulating layer 1 and the second insulating layer 3. The first circuit layer 2 includes a number of conductive strips. The third insulating layer 5 is arranged between the first insulating layer 1 and the first circuit layer 2. The second circuit layer 7 includes a number of conductive strips that are provided on an upper side face of the third insulating layer 5. Ends of the plurality of conductive strips of the second circuit layer 7 pass through the third insulating layer 5 and are correspondingly connected to the plurality of conductive strips of the first circuit layer 2 the first circuit layer 2. The third insulating layer 5, and the first insulating layer 1 each has a forepart extending beyond a front end of the second insulating layer 3. The reinforcing plate 11a is arranged on an upper side face of the first insulating layer 1. A metal layer 4 is disposed on an under side surface of foreparts of the plurality of conductive strips of the first circuit layer 2 to constitute metal fingers, and the reinforcing plate 11a is positioned right above the metal fingers.

In the embodiment, the forepart of the first circuit layer 2, the forepart of the third insulating layer 5, the forepart of the first insulating layer 1, and the reinforcing plate 11a extend beyond a front end of the second insulating layer 3, and are equal in length and width and completely overlap one another.

Embodiment 4

In one embodiment, a touch-sensitive screen is provided, comprising an FPC connector as described above. The FPC connector is configured to be directly inserted to a connector of a circuit board rather than being welded to a mainboard, such that the touch-sensitive screen is connected to the mainboard for obtaining power and signals.

Embodiment 5

In one embodiment, a display device is provided, comprising an FPC connector as described above. The FPC connector is configured to be directly inserted to a connector of a circuit board rather than being welded to a mainboard, such that the LCD screen is connected to the mainboard for obtaining power and signals.

Described above are only embodiments of the present application, and any modifications, equivalents, improvements and the like made within the scope of the claims of the present application shall be covered by the scope of the claims of the present application.

What is claimed is:

1. An FPC connector comprising:
    a first insulating layer (1), a first circuit layer (2), a second insulating layer (3), a third insulating layer (5), and a second circuit layer (7);
    wherein the first circuit layer (2) is arranged between the first insulating layer (1) and the second insulating layer (3), the first circuit layer (2) comprises a plurality of conductive strips; the third insulating layer (5) is arranged between the first insulating layer (1) and the first circuit layer (2), the second circuit layer (7) comprises a plurality of conductive strips that are provided on an upper side face of the third insulating layer (5);
    ends of the plurality of conductive strips of the second circuit layer (7) pass through the third insulating layer (5) and are correspondingly connected to the plurality of conductive strips of the first circuit layer (2); the first circuit layer (2) and the second insulating layer (3) each has a forepart extending beyond a front end of each of the first insulating layer (1), the third insulating layer (5), and the second circuit layer (7).

2. The FPC connector according to claim 1, wherein the third insulating layer (5) defines a plurality of vias (9), and the ends of the plurality of conductive strips of the second circuit layer (7) pass through the plurality of vias (9) and are correspondingly connected to the plurality of conductive strips of the first circuit layer (2).

3. The FPC connector according to claim 1, wherein foreparts of the plurality of conductive strips of the first circuit layer (2) are arranged in parallel at equal pitches.

4. The FPC connector according to claim 1, wherein a reinforcing plate (11) is provided at an underside of the second insulating layer (3), a metal layer (4) is disposed on an upper side surface of foreparts of the plurality of conductive strips of the first circuit layer (2) to constitute metal fingers, and the reinforcing plate (11) is positioned right below the metal fingers.

5. The FPC connector according to claim 4, wherein the first insulating layer (1), the second circuit layer (7), the third insulating layer (5), the first circuit layer (2), the second insulating layer (3) and the reinforcing plate (11) are sequentially bonded to one another by thermosetting adhesive and hot pressing.

6. The FPC connector according to claim 4, wherein the forepart of the first circuit layer (2), the forepart of the second insulating layer (3) and the reinforcing plate (11) extend beyond a front end of each of the first insulating layer (1), the third insulating layer (5), and the second circuit layer (7), and are equal in length and width and completely overlap one another.

7. An FPC connector comprising:
a first insulating layer (1), a first circuit layer (2), a second insulating layer (3), a third insulating layer (5), a second circuit layer (7), and a reinforcing plate (11a);
wherein the first circuit layer (2) is arranged between the first insulating layer (1) and the second insulating layer (3), the first circuit layer (2) comprises a plurality of conductive strips; the third insulating layer (5) is arranged between the first insulating layer (1) and the first circuit layer (2), the second circuit layer (7) comprises a plurality of conductive strips that are provided on an upper side face of the third insulating layer (5);
ends of the plurality of conductive strips of the second circuit layer (7) pass through the third insulating layer (5) and are correspondingly connected to the plurality of conductive strips of the first circuit layer (2); the first circuit layer (2), the third insulating layer (5), and the first insulating layer (1) each has a forepart extending beyond a front end of the second insulating layer (3); the reinforcing plate (11a) is arranged on an upper side face of the first insulating layer (1), a metal layer (4) is disposed on an under side surface of foreparts of the plurality of conductive strips of the first circuit layer (2) to constitute metal fingers, and the reinforcing plate (11a) is positioned right above the metal fingers.

8. The FPC connector according to claim 7, wherein the third insulating layer (5) defines a plurality of vias (9), and the ends of the plurality of conductive strips of the second circuit layer (7) pass through the plurality of vias (9) and are correspondingly connected to the plurality of conductive strips of the first circuit layer (2).

9. The FPC connector according to claim 7, wherein foreparts of the plurality of conductive strips of the first circuit layer (2) are arranged in parallel at equal pitches.

10. The FPC connector according to claim 7, wherein the reinforcing plate (11a), the first insulating layer (1), the second circuit layer (7), the third insulating layer (5), the first circuit layer (2), the second insulating layer (3) are sequentially bonded to one another by thermosetting adhesive and hot pressing.

11. The FPC connector according to claim 7, wherein the forepart of the first circuit layer (2), the forepart of the third insulating layer (5), the forepart of the first insulating layer (1), and the reinforcing plate (11a) extend beyond a front end of the second insulating layer (3), and are equal in length and width and completely overlap one another.

12. A touch-sensitive screen comprising:
an FPC connector comprising:
a first insulating layer (1), a first circuit layer (2), a second insulating layer (3), a third insulating layer (5), and a second circuit layer (7);
wherein the first circuit layer (2) is arranged between the first insulating layer (1) and the second insulating layer (3), the first circuit layer (2) comprises a plurality of conductive strips; the third insulating layer (5) is arranged between the first insulating layer (1) and the first circuit layer (2), the second circuit layer (7) comprises a plurality of conductive strips that are provided on an upper side face of the third insulating layer (5);
ends of the plurality of conductive strips of the second circuit layer (7) pass through the third insulating layer (5) and are correspondingly connected to the plurality of conductive strips of the first circuit layer (2); the first circuit layer (2) and the second insulating layer (3) each has a forepart extending beyond a front end of each of the first insulating layer (1), the third insulating layer (5), and the second circuit layer (7).

13. The touch-sensitive screen according to claim 12, wherein the third insulating layer (5) defines a plurality of vias (9), and the ends of the plurality of conductive strips of the second circuit layer (7) pass through the plurality of vias (9) and are correspondingly connected to the plurality of conductive strips of the first circuit layer (2).

14. The touch-sensitive screen according to claim 12, wherein foreparts of the plurality of conductive strips of the first circuit layer (2) are arranged in parallel at equal pitches.

15. The touch-sensitive screen according to claim 12, wherein a reinforcing plate (11) is provided at an underside of the second insulating layer (3), a metal layer (4) is disposed on an upper side surface of foreparts of the plurality of conductive strips of the first circuit layer (2) to constitute metal fingers, and the reinforcing plate (11) is positioned right below the metal fingers.

16. The touch-sensitive screen according to claim 15, wherein the first insulating layer (1), the second circuit layer (7), the third insulating layer (5), the first circuit layer (2), the second insulating layer (3) and the reinforcing plate (11) are sequentially bonded to one another by thermosetting adhesive and hot pressing.

17. The touch-sensitive screen according to claim 15, wherein the forepart of the first circuit layer (2), the forepart of the second insulating layer (3) and the reinforcing plate (11) extend beyond a front end of each of the first insulating layer (1), the third insulating layer (5), and the second circuit layer (7), and are equal in length and width and completely overlap one another.

18. A touch-sensitive screen comprising:
an FPC connector comprising:
a first insulating layer (1), a first circuit layer (2), a second insulating layer (3), a third insulating layer (5), a second circuit layer (7), and a reinforcing plate (11a);

wherein the first circuit layer (2) is arranged between the first insulating layer (1) and the second insulating layer (3), the first circuit layer (2) comprises a plurality of conductive strips; the third insulating layer (5) is arranged between the first insulating layer (1) and the first circuit layer (2), the second circuit layer (7) comprises a plurality of conductive strips that are provided on an upper side face of the third insulating layer (5);

ends of the plurality of conductive strips of the second circuit layer (7) pass through the third insulating layer (5) and are correspondingly connected to the plurality of conductive strips of the first circuit layer (2); the first circuit layer (2), the third insulating layer (5), and the first insulating layer (1) each has a forepart extending beyond a front end of the second insulating layer (3);

the reinforcing plate (11a) is arranged on an upper side face of the first insulating layer (1), a metal layer (4) is disposed on an under side surface of foreparts of the plurality of conductive strips of the first circuit layer (2) to constitute metal fingers, and the reinforcing plate (11a) is positioned right above the metal fingers.

19. The touch-sensitive screen according to claim 18, wherein the third insulating layer (5) defines a plurality of vias (9), and the ends of the plurality of conductive strips of the second circuit layer (7) pass through the plurality of vias (9) and are correspondingly connected to the plurality of conductive strips of the first circuit layer (2).

20. The touch-sensitive screen according to claim 18, wherein foreparts of the plurality of conductive strips of the first circuit layer (2) are arranged in parallel at equal pitches.

21. The touch-sensitive screen according to claim 18, wherein the reinforcing plate (11a), the first insulating layer (1), the second circuit layer (7), the third insulating layer (5), the first circuit layer (2), the second insulating layer (3) are sequentially bonded to one another by thermosetting adhesive and hot pressing.

22. The touch-sensitive screen according to claim 18, wherein the forepart of the first circuit layer (2), the forepart of the third insulating layer (5), the forepart of the first insulating layer (1), and the reinforcing plate (11a) extend beyond a front end of the second insulating layer (3), and are equal in length and width and completely overlap one another.

23. A display device comprising:
an FPC connector comprising:
a first insulating layer (1), a first circuit layer (2), a second insulating layer (3), a third insulating layer (5), and a second circuit layer (7);
wherein the first circuit layer (2) is arranged between the first insulating layer (1) and the second insulating layer (3), the first circuit layer (2) comprises a plurality of conductive strips; the third insulating layer (5) is arranged between the first insulating layer (1) and the first circuit layer (2), the second circuit layer (7) comprises a plurality of conductive strips that are provided on an upper side face of the third insulating layer (5);
ends of the plurality of conductive strips of the second circuit layer (7) pass through the third insulating layer (5) and are correspondingly connected to the plurality of conductive strips of the first circuit layer (2); the first circuit layer (2) and the second insulating layer (3) each has a forepart extending beyond a front end of each of the first insulating layer (1), the third insulating layer (5), and the second circuit layer (7).

24. The display device according to claim 23, wherein the third insulating layer (5) defines a plurality of vias (9), and the ends of the plurality of conductive strips of the second circuit layer (7) pass through the plurality of vias (9) and are correspondingly connected to the plurality of conductive strips of the first circuit layer (2).

25. The display device according to claim 23, wherein foreparts of the plurality of conductive strips of the first circuit layer (2) are arranged in parallel at equal pitches.

26. The display device according to claim 23, wherein a reinforcing plate (11) is provided at an underside of the second insulating layer (3), a metal layer (4) is disposed on an upper side surface of foreparts of the plurality of conductive strips of the first circuit layer (2) to constitute metal fingers, and the reinforcing plate (11) is positioned right below the metal fingers.

27. The display device according to claim 26, wherein the first insulating layer (1), the second circuit layer (7), the third insulating layer (5), the first circuit layer (2), the second insulating layer (3) and the reinforcing plate (11) are sequentially bonded to one another by thermosetting adhesive and hot pressing.

28. The display device according to claim 26, wherein the forepart of the first circuit layer (2), the forepart of the second insulating layer (3) and the reinforcing plate (11) extend beyond a front end of each of the first insulating layer (1), the third insulating layer (5), and the second circuit layer (7), and are equal in length and width and completely overlap one another.

29. A display device comprising:
an FPC connector comprising:
a first insulating layer (1), a first circuit layer (2), a second insulating layer (3), a third insulating layer (5), a second circuit layer (7), and a reinforcing plate (11a);
wherein the first circuit layer (2) is arranged between the first insulating layer (1) and the second insulating layer (3), the first circuit layer (2) comprises a plurality of conductive strips; the third insulating layer (5) is arranged between the first insulating layer (1) and the first circuit layer (2), the second circuit layer (7) comprises a plurality of conductive strips that are provided on an upper side face of the third insulating layer (5);
ends of the plurality of conductive strips of the second circuit layer (7) pass through the third insulating layer (5) and are correspondingly connected to the plurality of conductive strips of the first circuit layer (2); the first circuit layer (2), the third insulating layer (5), and the first insulating layer (1) each has a forepart extending beyond a front end of the second insulating layer (3);
the reinforcing plate (11a) is arranged on an upper side face of the first insulating layer (1), a metal layer (4) is disposed on an under side surface of foreparts of the plurality of conductive strips of the first circuit layer (2) to constitute metal fingers, and the reinforcing plate (11a) is positioned right above the metal fingers.

30. The display device according to claim 29, wherein the third insulating layer (5) defines a plurality of vias (9), and the ends of the plurality of conductive strips of the second circuit layer (7) pass through the plurality of vias (9) and are correspondingly connected to the plurality of conductive strips of the first circuit layer (2).

31. The display device according to claim 29, wherein foreparts of the plurality of conductive strips of the first circuit layer (2) are arranged in parallel at equal pitches.

32. The display device according to claim 29, wherein the reinforcing plate (11*a*), the first insulating layer (1), the second circuit layer (7), the third insulating layer (5), the first circuit layer (2), the second insulating layer (3) are sequentially bonded to one another by thermosetting adhesive and hot pressing.

33. The display device according to claim 29, wherein the forepart of the first circuit layer (2), the forepart of the third insulating layer (5), the forepart of the first insulating layer (1), and the reinforcing plate (11*a*) extend beyond a front end of the second insulating layer (3), and are equal in length and width and completely overlap one another.

\* \* \* \* \*